(12) United States Patent
Lee et al.

(10) Patent No.: US 7,750,729 B2
(45) Date of Patent: Jul. 6, 2010

(54) INTERNAL VOLTAGE GENERATOR

(75) Inventors: Jun-Phyo Lee, Yongin-si (KR);
Young-Gu Kang, Seoul (KR);
Beob-Rae Cho, Suwon-si (KR)

(73) Assignee: Samsung Electronics Co., Ltd.,
Gyeonggi-do (KR)

( * ) Notice: Subject to any disclaimer, the term of this patent is extended or adjusted under 35 U.S.C. 154(b) by 160 days.

(21) Appl. No.: 12/071,830

(22) Filed: Feb. 27, 2008

(65) Prior Publication Data

US 2008/0204125 A1    Aug. 28, 2008

(30) Foreign Application Priority Data

Feb. 27, 2007   (KR) ...................... 10-2007-0019759

(51) Int. Cl.
*G05F 1/10* (2006.01)
(52) U.S. Cl. ................. 327/544; 327/540; 327/541; 327/543
(58) Field of Classification Search ........... 327/427, 327/538, 540–544
See application file for complete search history.

(56) References Cited

U.S. PATENT DOCUMENTS

| | | | |
|---|---|---|---|
| 6,034,563 A * | 3/2000 | Mashiko | 327/544 |
| 6,107,700 A * | 8/2000 | Ishikawa et al. | 327/544 |
| 6,768,370 B2 * | 7/2004 | Takahashi et al. | 327/540 |

FOREIGN PATENT DOCUMENTS

| | | |
|---|---|---|
| JP | 09-116417 | 5/1997 |
| JP | 11-340806 | 12/1999 |
| KR | 10-0284290 | 12/2000 |
| KR | 1020040002270 | 1/2004 |
| KR | 10-2005-0054536 | 6/2005 |

* cited by examiner

*Primary Examiner*—Long Nguyen
(74) *Attorney, Agent, or Firm*—Harness, Dickey & Pierce, L.L.C.

(57) ABSTRACT

An internal voltage generator is disclosed. The internal voltage generator may include a comparator for controlling a voltage of a first node in response to a voltage difference between a reference voltage and an internal voltage, an internal voltage driving portion connected between a driving node and an internal voltage node to apply the internal voltage to the internal voltage node in response to a voltage level of the first node, and/or a leakage current interrupting portion to apply an external voltage to the first node to deactivate the internal voltage driving portion and to interrupt the external voltage applied to the driving node to interrupt a leakage current.

9 Claims, 3 Drawing Sheets

INTERNAL VOLTAGE GENERATOR

PRIORITY STATEMENT

This application claims the benefit of Korean Patent Application No. 2007-0019759, filed Feb. 27, 2007, the disclosure of which is incorporated herein in its entirety by reference.

BACKGROUND

As integration of a semiconductor device increases, the gate length and the oxide layer thickness of an MOS transistor may decrease. In order to increase reliability of the MOS transistor and lower power consumption, a semiconductor device may have an internal voltage generator that lowers a voltage level of an external voltage to generate an internal voltage.

FIG. 1 is a circuit diagram illustrating a conventional internal voltage generator. In the internal voltage generator of FIG. 1, a mode determining portion 11 may determine whether a semiconductor device is in a normal mode or a deep power down mode in response to a deep power down signal PDPDE. The deep power down mode may be a technique used to prevent unnecessary power consumption in a semiconductor device which employs an internal voltage generator. When a semiconductor device enters the deep power down mode, an internal voltage Vint applied to an internal portion of a semiconductor device may be interrupted where an external voltage Vcc is applied to thereby prevent unnecessary power consumption. For example, in a semiconductor memory device such as a dynamic random access memory (DRAM), an internal voltage Vint supplied to a memory cell may be temporarily interrupted where data of a memory cell may not need to be retained.

A sleep mode applied to a portable semiconductor device may allow an internal voltage Vint to be supplied to a semiconductor device to maintain fundamental data, whereas the deep power down mode may start when data does not have to be retained and thus an internal voltage Vint applied to a semiconductor device may be interrupted.

The mode determining portion 11 may include a first inverter INV1 for inverting the deep power down signal PDPDE and a PMOS transistor PM for applying an external voltage Vcc to a first node Node1 in response to an inverted deep power down signal PDPDE. The first inverter INV1 may be driven by the external voltage Vcc and a ground voltage Vss, and the inverted deep power down signal PDPDE outputted from the first inverter INV1 may swing between the external voltage Vcc level and the ground voltage Vss level. The PMOS transistor PM may be turned on to apply the external voltage Vcc to the first node Node1 when the inverted deep power down signal PDPDE is at the ground voltage Vss level and may be turned off when the inverted deep power down signal PDPDE is at the external voltage Vcc level.

An internal voltage driving portion 12 may include driving PMOS transistors PD1 to PDn. In FIG. 1, the internal voltage driving portion 12 may include a plurality of driving PMOS transistors PD1 to PDn to supply a sufficient current to an internal portion of the semiconductor device, but if an electrical current consumed by the semiconductor device is sufficiently small, the internal voltage driving portion 12 may include only a single driving PMOS transistor. Also, even though a consumption current of the semiconductor device may be relatively large, the internal voltage driving portion 12 may still only include one large-scaled driving PMOS transistor, which may supply a large amount of current.

In FIG. 1, a plurality of driving PMOS transistors PD1 to PDn may be connected in parallel between the external voltage Vcc and an internal voltage node Node11 and may commonly receive a voltage level of the first node Node1 through their respective gates. Each of a plurality of driving PMOS transistors PD1 to PDn may selectively apply the external voltage Vcc to the internal voltage Vint through the internal voltage node Node11, in response to a voltage level of the first node Node1.

A comparator AMP may receive a reference voltage Vref through a negative terminal and the internal voltage Vint through a positive terminal and may adjust a voltage level of the first node Node1 in response to a voltage difference between the reference voltage Vref and the internal voltage Vint.

An operation of the conventional internal voltage generator of FIG. 1 is described below. The deep power down signal PDPDE may be applied at a low level to the internal voltage generator during a normal mode and may be applied at a high level to the internal voltage generator during the deep power down mode. The deep power down signal PDPDE applied to the internal voltage generator may be an input signal of the first inverter INV1, and so its low level may be the ground voltage Vss level and its high level may be the external voltage Vcc level. If the deep power down signal PDPDE of a low level is applied to the mode determining portion 11 during the normal mode of the semiconductor device, the first inverter INV1 may invert the deep power down signal PDPDE and may apply the inverted deep power down signal PDPDE at the external voltage Vcc level to the PMOS transistor PM. The PMOS transistor PM may be turned off in response to the inverted deep power down signal PDPDE at the external voltage Vcc level, and the first node may become a floating state.

The comparator AMP may receive the reference voltage Vref and the internal voltage Vint and may detect a voltage difference of the two voltages Vref and Vint. If the internal voltage Vint is lower than the reference voltage Vref, the comparator AMP may lower a level of the first node Node1. The driving PMOS transistors PD1 to PDn may selectively apply the external voltage Vcc to raise the voltage level of the internal voltage Vint, as applied to the internal voltage node Node11, in response to a voltage level of the first node Node1.

If a voltage level of the internal voltage Vint is higher than a voltage level of the reference voltage Vref, the comparator AMP may raise a voltage level of the first node Node1. The driving PMOS transistors PD1 to PDn may selectively apply the external voltage Vcc to lower the voltage level of the internal voltage Vint, as applied to the internal voltage node Node11, in response to a voltage level of the first node Node1.

The reference voltage Vref is a signal which may not be affected by a variation of the external voltage Vcc, the temperature and/or a manufacturing process. The reference voltage Vref may keep a constant level, and may be used to prevent the internal voltage Vint generated in the internal voltage generator from being changed by external factors. The comparator AMP and the driving PMOS transistors PD1 to PDn of the internal voltage driving portion 12 may form a feedback loop to suppress a variation of the internal voltage Vint according to a variation of an internal load of the semiconductor device.

When the semiconductor device is in the deep power down mode, the deep power down signal PDPDE may be applied at a high level to the internal voltage generator. The first inverter INV1 may invert the deep power down signal PDPDE, and may apply the inverted deep power down signal PDPDE at the ground voltage Vss level, to the PMOS transistor PM. The PMOS transistor PM may be turned on to apply the external voltage Vcc to the first node Node1 in response to the inverted deep power down signal PDPDE.

The driving PMOS transistors PD1 to PDn may be turned off in response to the external voltage Vcc of the first node Node1, the internal voltage node Node11 may become a floating state, and an electrical current may not flow to the internal portion of the semiconductor device.

In the conventional internal voltage generator, the driving PMOS transistors PD1 to PDn may be large-scaled to drive a large electrical current and have the very thin oxide layer in order to lower an operating point. However, the internal voltage generator which employs such driving PMOS transistors PD1 to PDn may have a problem in that a leakage current, such as a gate induced drain leakage, may occur in the deep power down mode.

SUMMARY

Example embodiments may provide an internal voltage generator in which a leakage current is reduced or prevented in the deep power down mode.

According to example embodiments, an internal voltage generator may include an internal voltage driving portion connected between a driving node and an internal voltage node for applying an internal voltage to the internal voltage node in response to a voltage level of a first node, and/or a leakage current interrupting portion to apply an external voltage to the first node to deactivate the internal voltage driving portion and to interrupt the external voltage applied to the driving node to thereby interrupt a leakage current, during a deep power down mode.

An internal voltage driving portion may further include a comparator to control a voltage of a first node in response to a voltage difference between a reference voltage and an internal voltage.

The internal voltage driving portion may include at least one driving PMOS transistor connected in parallel between the driving node and the internal voltage node, the at least one driving PMOS transistor to selectively apply a voltage of the driving node to the internal voltage node in response to a voltage level of the first node.

The leakage current interrupting portion may include a mode determining portion to apply the external voltage to the first node in response to a first deep power down signal and to output an inverted first deep power down signal. The leakage current interrupting portion may also include and a leakage current preventing portion to interrupt the external voltage applied to the driving node in response to the inverted first deep power down signal.

The mode determining portion may include a first inverter connected between the external voltage and a substrate voltage, the first inverter to invert the first deep power down signal output the inverted first deep power down signal. The mode determining portion may also include a mode determining PMOS transistor connected between the external voltage and the first node, the mode determining PMOS transistor to apply the external voltage to the first node in response to the inverted first deep power down signal.

The leakage current preventing portion may include a second inverter connected between the external voltage and a substrate voltage, the second inverter to invert the inverted first deep power down signal. The leakage current preventing portion may also include at least one control PMOS transistor connected in parallel between the external voltage and the driving node, the at least one control PMOS transistor to interrupt a voltage applied to the driving node in response to an output signal of the second inverter.

According to example embodiments, the leakage current interrupting portion may include a mode determining portion to apply the external voltage to the first node in response to the first deep power down signal, and/or a leakage current preventing portion to interrupt the external voltage applied to the driving node in response to a second deep power down signal having the same phase as the first deep power down signal.

According to example embodiments, the mode determining portion may include a first inverter connected between the external voltage and a ground voltage, the first inverter to invert the first deep power down signal and output the inverted first deep power down signal. The mode determining portion may also include a mode determining PMOS transistor connected between the external voltage and the first node, the mode determining PMOS transistor to apply the external voltage to the first node in response to the inverted first deep power down signal.

The leakage current preventing portion may include a second inverter connected between a boosted voltage and a ground voltage to invert the second deep power down signal. The leakage current preventing portion may also include at least one control PMOS transistor connected in parallel between the external voltage and the driving node, the at least one control PMOS transistor to interrupt a voltage applied to the driving node in response to the inverted second deep power down signal.

According to example embodiments, an internal voltage generator may include an internal voltage driving portion connected between an external voltage and a driving node, the internal voltage portion to apply an internal voltage to the driving node in response to a voltage of a first node, and/or a leakage current interrupting portion to apply an external voltage to the first node to deactivate the internal voltage driving portion and to interrupt the internal voltage applied to the internal voltage node to thereby interrupt a leakage current, during a deep power down mode. An internal voltage driving portion may further include a comparator to control a voltage of a first node in response to a voltage difference between a reference voltage and an internal voltage.

The internal voltage driving portion may include at least one driving PMOS transistor connected in parallel between the external voltage and the driving node, and the at least one driving PMOS transistor to selectively apply a voltage of the external voltage to the driving node in response to a voltage level of the first node.

The leakage current interrupting portion may include a mode determining portion to apply the external voltage to the first node in response to a first deep power down signal and to output an inverted first deep power down signal. The leakage current interrupting portion may also include a leakage current preventing portion to interrupt the internal voltage applied to the internal voltage node in response to the inverted first deep power down signal.

The mode determining portion may include a first inverter connected between the external voltage and a substrate voltage, the first inverter to invert the first deep power down signal and to output the inverted first deep power down signal, and/or a mode determining PMOS transistor connected between the external voltage and the first node, the mode determining PMOS transistor to apply the external voltage to the first node in response to the inverted first deep power down signal.

The leakage current preventing portion may include a second inverter connected between the external voltage and a substrate voltage, the second inverter to invert the inverted first deep power down signal, and/or at least one control PMOS transistor connected in parallel between the internal voltage node and the driving node, the at least one control PMOS transistor to interrupt a voltage applied to the internal voltage node in response to an output signal of the second inverter.

The leakage current interrupting portion may include a mode determining portion to apply the external voltage to the first node in response to the first deep power down signal, and/or a leakage current preventing portion to interrupt the external voltage applied to the internal voltage node in response to a second deep power down signal having the same phase as the first deep power down signal.

The mode determining portion may include a first inverter connected between the external voltage and a ground voltage, the first inverter to invert the first deep power down signal and to output the inverted first deep power down signal. The mode determining portion may also include a mode determining PMOS transistor connected between the external voltage and the first node, the mode determining PMOS transistor to apply the external voltage to the first node in response to the inverted first deep power down signal.

The leakage current preventing portion may include a second inverter connected between a boosted voltage and a ground voltage, the second inverter to invert the second deep power down signal, and/or at least one control PMOS transistor connected in parallel between the driving node and the internal voltage node, the at least one control PMOS transistor to interrupt a voltage applied to the internal voltage node in response to the inverted second deep power down signal.

BRIEF DESCRIPTION

The above and other features and advantages will become more apparent to those of ordinary skill in the art by describing in detail example embodiments thereof with reference to the attached drawings in which.

DETAILED DESCRIPTION

Figure 1:
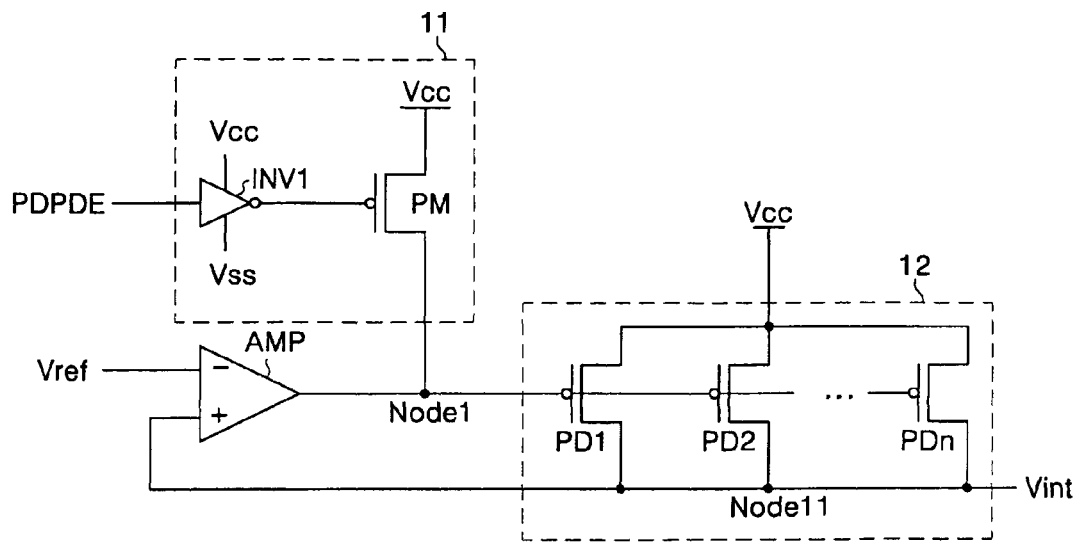
FIG. 1 is a circuit diagram illustrating a conventional internal voltage generator.

Example embodiments will now be described more fully hereinafter with reference to the accompanying drawings. Example embodiments may, however, be embodied in different forms and should not be construed as limited to example embodiments set forth herein. Rather, these example embodiments are provided so that this disclosure will be thorough and complete, and will fully convey the scope of example embodiments to those skilled in the art. In the drawings, the thickness of layers and regions are exaggerated for clarity. Like numbers refer to like elements throughout the specification.

Specific structural and functional details disclosed herein are merely representative for purposes of describing example embodiments. Example embodiments may, however, may be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of example embodiments.

It will be understood that, although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Although the example embodiments have been disclosed for illustrative purposes, those skilled in the art will appreciate that various modifications, additions and substitutions are possible, without departing from the scope and spirit of example embodiments as disclosed in the accompanying claims.

Figure 2:
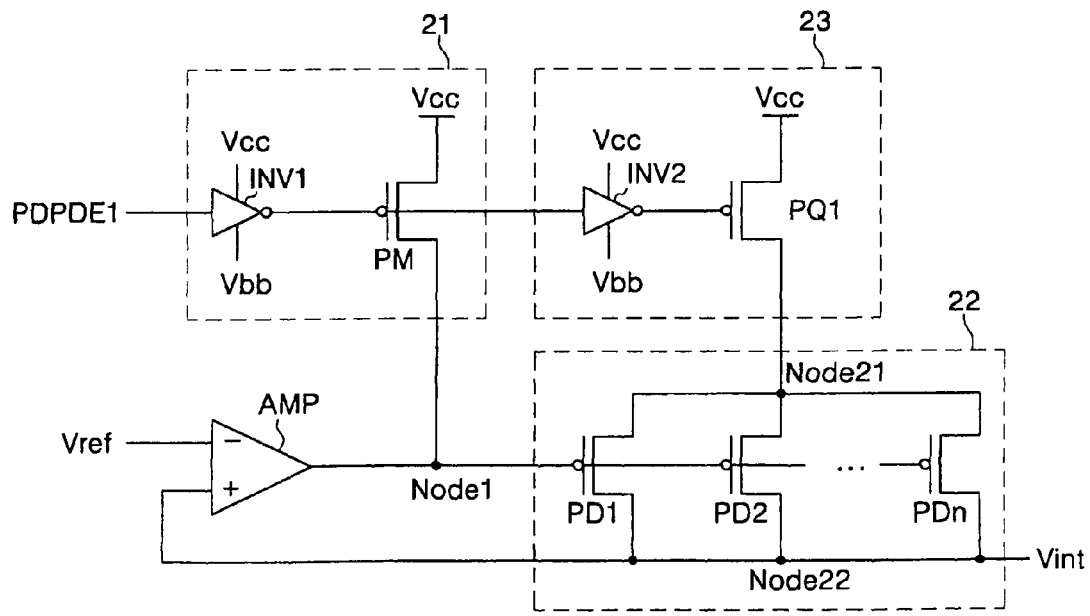
FIG. 2 is a circuit diagram illustrating an internal voltage generator according to example embodiments.

FIG. 2 is a circuit diagram illustrating an internal voltage generator according to example embodiments. The internal voltage generator of FIG. 2 may include a mode determining portion 21, a comparator AMP, an internal voltage driving portion 22, and a leakage current preventing portion 23.

The mode determining portion 21 may apply an external voltage Vcc to a first node Node1 in response to a first deep power down signal PDPDE1 when a semiconductor device is in a deep power down mode. The comparator AMP may adjust a voltage level of the first node Node1 in response to a voltage difference between a reference voltage Vref and an internal voltage Vint when the semiconductor device is in a normal mode. The internal voltage driving portion 22 may selectively apply a voltage at driving node Node21 to the internal voltage Vint, through an internal voltage node Node22 in response to a voltage level of the first node Node1. The leakage current preventing portion 23 may selectively apply the external voltage Vcc to the driving node Node21 in response to an inverted first deep power down signal PDPDE1 applied from the mode determining portion 21.

The mode determining portion 21 may include a first inverter INV1 for inverting the first deep power down signal PDPDE1 and a PMOS transistor PM for applying the external voltage Vcc to the first node Node1 in response to the inverted first deep power down signal PDPDE1.

Since the first inverter INV1 may be driven by the external voltage Vcc and a substrate voltage Vbb, the inverted first deep power down signal PDPDE1 outputted from the first inverter INV1 may swing between the external voltage Vcc level and the substrate voltage Vbb level. Unlike the deep power down signal PDPDE of FIG. 1, the first deep power down signal PDPDE1 of FIG. 2 may swing between the external voltage Vcc level and the substrate voltage Vbb level of the first inverter INV1.

The PMOS transistor PM may be turned on to apply the external voltage Vcc to the first node Node1 when the inverted first deep power down signal PDPDE1 has the substrate voltage Vbb level, and may be turned off when the inverted first deep power down signal PDPDE1 has the external voltage Vcc level.

The internal voltage driving portion 22 may include a plurality of driving PMOS transistors PD1 to PDn. The internal voltage driving portion 22 may have a plurality of driving PMOS transistors PD1 to PDn in order to sufficiently supply an electric current to the internal portion of the semiconductor device. However, when electric current consumption of the semiconductor device is sufficiently small, the internal voltage driving portion 22 may have only one driving PMOS transistor. Also, even when the current consumption of the semiconductor device may be sufficiently large, the internal voltage driving portion 22 may have one large-scaled PMOS transistor which may sufficiently supply a large amount of electric current.

A plurality of driving PMOS transistors PD1 to PDn may be connected in parallel between the driving node Node21 and the internal voltage node Node22 and commonly receive a voltage level of the first node Node1 through their respective gates. Each of the plurality of driving PMOS transistor PD1 to PDn may selectively apply a voltage level of the driving node Node21 to supply the internal voltage Vint, through the internal voltage node Node22, in response to a voltage level of the first node Node1.

The comparator AMP may receive the reference voltage Vref through a negative terminal and the internal voltage Vint through a positive terminal, and may adjust a voltage level of the first node Node1 in response to a voltage difference between the reference voltage Vref and the internal voltage Vint.

The leakage current preventing portion 23 may include a second inverter INV2 and a control PMOS transistor PQ1. The second inverter INV2 may receive and invert the inverted first deep power down signal PDPDE1 to output the first deep power down signal PDPDE1. The control PMOS transistor PQ1 may selectively apply the external voltage Vcc to the driving node Node21 in response to the first deep power down signal PDPDE1 outputted from the second inverter INV2.

The control PMOS transistor PQ1 may be turned on to apply the external voltage Vcc to the driving node Node21 in response to the first deep power down signal PDPDE1, outputted from the second inverter INV2, having the substrate voltage Vbb level during the normal mode. The control PMOS transistor PQ1 may be turned off to interrupt the external voltage Vcc from being applied to the driving node Node21, in response to the first deep power down signal PDPDE1, outputted from the second inverter INV2, having the external voltage Vcc level during the deep power down mode.

FIG. 2 shows one control PMOS transistor PQ1, but a plurality of control PMOS transistors PQ1 may be arranged in order to sufficiently supply an electric current to the internal voltage driving portion 22. Alternatively, one large-scaled control PMOS transistor PQ1 may be arranged to sufficiently supply an electric current to the internal voltage driving portion 22.

In order to make it easier for the control PMOS transistor PQ1 to supply an electric current to the internal voltage driving portion 22, the first deep power down signal PDPDE1 applied to the control PMOS transistor PQ1 may swing between the substrate voltage Vbb level and the external voltage Vcc level. That is, the substrate voltage Vbb having a voltage level lower than the ground voltage Vss level may be applied to the gate of the control PMOS transistor PQ1 to make a turn-on operation of the control PMOS transistor PQ1 smoother.

The second inverter INV2 may be driven by the external voltage Vcc and the substrate voltage Vbb, may receive as an input the inverted signal of the first deep power down signal PDPDE1, and may output the first deep power down signal PDPDE1, which may swing between the substrate voltage Vbb level and the external voltage Vcc level to thereby selectively control the PMOS transistor PQ1.

Therefore, the first inverter INV1 may be driven by the external voltage Vcc and the substrate voltage Vbb, may receive the first deep power down signal PDPDE1 as an input, and output the inverted first deep power down signal PDPDE1, which may swing between the substrate voltage Vbb level and the external voltage Vcc level.

In order to make it easier for the control PMOS transistor PQ1 to supply an electric current to the internal voltage driving portion 22, a swing voltage level of the first deep power down signal PDPDE1 and a voltage level of the driving voltage of the first and second inverters INV1 and INV2 may be set to the external voltage Vcc level and the substrate voltage Vbb level. However, if the control PMOS transistor PQ1 is stably turned on at the ground voltage Vss level, a swing voltage level of the first deep power down signal PDPDE1 and a voltage level of the driving voltage of the first and second inverters INV1 and INV2 may be set to the external voltage Vcc level and the ground voltage Vss level.

An operation of the internal voltage generator of FIG. 2 according to example embodiments is described below.

The first deep power down signal PDPDE1 may be applied to the internal voltage generator with a low level during the normal mode and may be applied to the internal voltage generator with a high level during the deep power down mode. Since the first deep power down signal PDPDE1 applied to the internal voltage generator may an input signal of the first inverter INV1, a low level may be the substrate voltage Vbb level, and a high level may be the external voltage Vcc level. When the semiconductor device is in the normal mode, if the first deep power down signal PDPDE1 of a low level is applied to the mode determining portion 21, the first inverter INV1 may invert the first deep power down signal PDPDE1 and may apply an inverted first deep power down signal PDPDE1 having the external voltage Vcc level to the PMOS transistor PM. The PMOS transistor PM may be turned off in response to the inverted first deep power down signal PDPDE1 having the external voltage Vcc level, and the first node Node1 may become a floating state.

The comparator AMP may receive the reference voltage Vref and the internal voltage Vint and may detect a voltage difference between the two voltages Vref and Vint. If the internal voltage Vint is lower in voltage level than the reference voltage Vref, the comparator AMP may lower a voltage level to be outputted to the first node Node1. Therefore, the driving PMOS transistors PD1 to PDn may selectively apply a voltage level of the driving node Node21, which is a selectively applied external voltage Vcc, to raise a voltage level of the internal voltage Vint, as applied to the internal voltage node Node22 in response to a voltage level of the first node Node1.

If the internal voltage Vint is higher in voltage level than the reference voltage Vref, the comparator AMP may raise a voltage level to be outputted to the first node Node1. Therefore, the driving PMOS transistors PD1 to PDn may selectively apply a voltage level of the driving node Node21, which is a selectively applied external voltage Vcc, to lower a voltage level of the internal voltage Vint, as applied to the internal voltage node Node22 in response to a voltage level of the first node Node1.

When the semiconductor device is in the deep power down mode, the first deep power down signal PDPDE1 may be applied to the internal voltage generator with a high level. The first inverter INV1 may invert the first deep power down signal PDPDE1 having a high level and apply an inverted first deep power down signal PDPDE1 having the substrate voltage Vbb level to the PMOS transistor PM. The PMOS transistor PM may be turned on to apply the external voltage Vcc to the first node Node1 in response to the inverted first deep power down signal PDPDE1 having the substrate voltage level Vbb.

The second inverter INV2 of the leakage current preventing portion 23 may invert the inverted first deep power down signal PDPDE1 having the substrate voltage Vbb level outputted from the first inverter INV1 and may apply it as the first deep power down signal PDPDE1 having the external voltage Vcc level. The control PMOS transistor PQ1 may be turned off to interrupt an electric current which flows through the driving node Node21 in response to the first deep power down signal PDPDE1 having the external voltage Vcc level.

All of the driving PMOS transistors PD1 to PDn may be turned off in response to the external voltage Vcc level of the first node Node1, so that flow of electric current between the driving node Node21 and the internal voltage node Node22 is interrupted and the internal voltage Vint becomes a floating state. Therefore, an electric current may not leak in to the internal portion of the semiconductor device.

The internal voltage generator of FIG. 1 may be configured such that the external voltage Vcc is applied directly to the internal voltage driving portion 12 and the internal voltage driving portion 12 supplies the internal voltage node Node11 with the internal voltage Vint, whereas the internal voltage generator of FIG. 2 may be configured such that the external voltage Vcc is applied to the internal voltage driving portion 22 through the leakage current preventing portion 23. Therefore, during the deep power down mode, the internal voltage driving portion 22 and the leakage current preventing portion 22 may interrupt an electric current which flows to the internal portion of the semiconductor device, thereby interrupting a leakage current.

Figure 3:
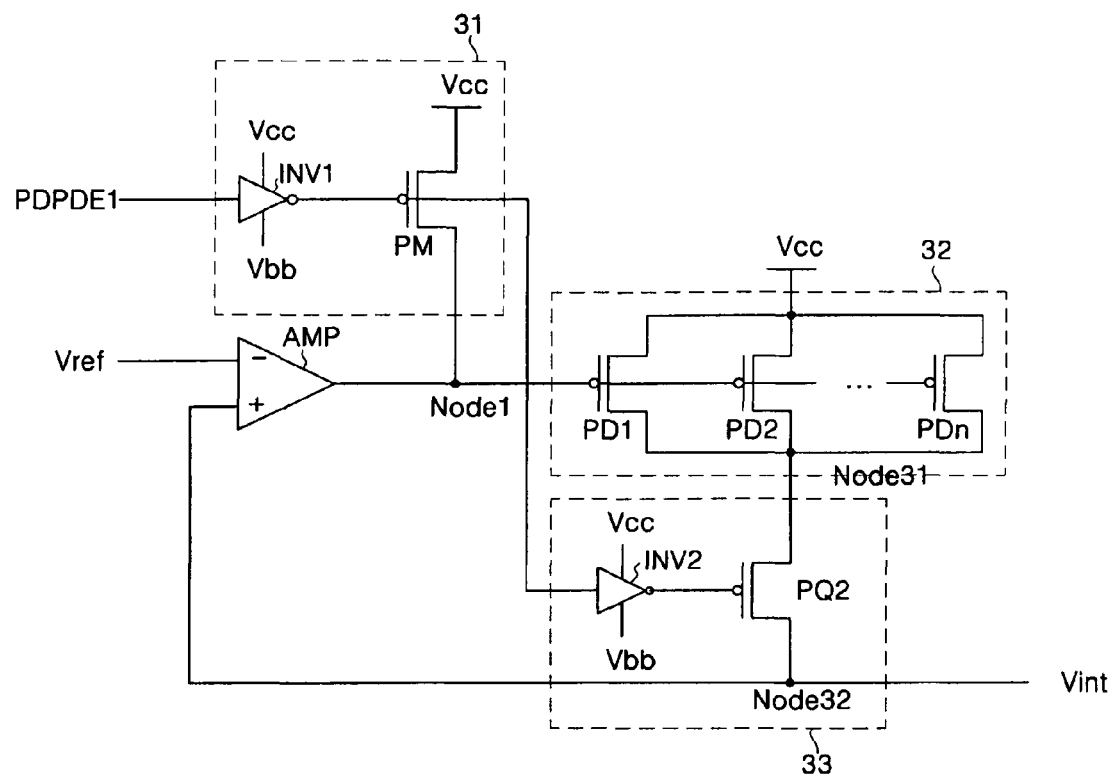
FIG. 3 is a circuit diagram illustrating another internal voltage generator according to example embodiments.

FIG. 3 is a circuit diagram illustrating another internal voltage generator according to example embodiments. The internal voltage generator of FIG. 3 may include a mode determining portion 31, a comparator AMP, an internal voltage driving portion 32, and a leakage current preventing portion 33.

The mode determining portion 31 and the comparator AMP of FIG. 3 may be similar to those of FIG. 2, and thus descriptions of those are omitted.

The internal voltage driving portion 32 may selectively apply the external voltage Vcc to the internal voltage Vint through a driving node Node31 in response to a voltage level of a first node Node1. The leakage current preventing portion 33 may selectively apply the internal voltage Vint at the driving node Node31 to an internal voltage node Node32 in response to the inverted first deep power down signal PDPDE1 applied from the mode determining portion 31.

The internal voltage driving portion 32 may include driving PMOS transistors PD1 to PDn. As described above, if an electrical current consumed by the semiconductor device is sufficiently small, the internal voltage driving portion 32 may have only one driving PMOS transistor. Also, even when a consumption current of the semiconductor device is sufficiently large, the internal voltage driving portion 32 may include one large-scaled driving PMOS transistor which may supply a sufficiently large current.

A plurality of driving PMOS transistors PD1 to PDn may be connected in parallel between an external voltage Vcc and the driving node Node31, and may commonly receive a voltage level of the first node Node1 through their respective gates. Each of a plurality of driving PMOS transistors PD1 to PDn may selectively apply the external voltage Vcc to the internal voltage Vint through the internal voltage node Node31 in response to a voltage level of the first node Node1.

The leakage current preventing portion 33 may include a second inverter INV2 and a control PMOS transistor PQ2. The second inverter INV2 may receive and invert the inverted first deep power down signal PDPDE1 from the mode determining portion 31 and output the first deep power down signal PDPDE1. The control PMOS transistor PQ2 may selectively apply to the internal voltage Vint, the voltage at driving node Node31 through the internal voltage node Node32, in response to the first deep power down signal PDPDE1 outputted from the second inverter INV2.

The control PMOS transistor PQ2 may be turned on to selectively apply to the internal voltage Vint, a voltage level of the driving node Node31 though the internal voltage node Node32, in response to the first deep power down signal PDPDE1 having the substrate voltage Vbb level, as applied during the normal mode. To interrupt the voltage at the internal voltage node Node32, which is being applied to the internal voltage Vint, the external voltage Vcc level may be applied at the node Node1 in response to the first deep power down signal PDPDE1 having a high level at the external voltage Vcc level applied to the PMOS transistor PM during the deep power down mode.

Similar to FIG. 2, FIG. 3 shows one control PMOS transistor PQ2, but a plurality of control PMOS transistors may be arranged in order to sufficiently supply an electric current to the internal voltage node Node32. Alternatively, one large-scaled control PMOS transistor PQ2 may be arranged to sufficiently supply an electric current to the internal voltage node Node32.

In order to make it easier for the control PMOS transistor PQ2 to supply an electric current to the internal voltage node Node32, the first deep power down signal PDPDE1 applied to the control PMOS transistor PQ2 may swing between the substrate voltage Vbb level and the external voltage Vcc level.

As described in FIG. 2, if the control PMOS transistor PQ2 is stably turned on at the ground voltage Vss level, a swing voltage level of the first deep power down signal PDPDE1 and a voltage level of the driving voltage of the first and second inverters INV1 and INV2 may be set to the external voltage Vcc level and the ground voltage Vss level.

An operation of the internal voltage generator of FIG. 3 according to the example embodiments is described below.

The first deep power down signal PDPDE1 may be applied to the internal voltage generator with a low level during the normal mode and may be applied to the internal voltage generator with a high level during the deep power down mode. Since the first deep power down signal PDPDE1 applied to the internal voltage generator may be an input signal of the first inverter INV1, a low level may be the substrate voltage Vbb level, and a high level may be the external voltage Vcc level. When the semiconductor device is in the normal mode, if the first deep power down signal PDPDE1 of a low level is applied to the mode determining portion 31, the first inverter INV1 may invert the first deep power down signal PDPDE1 and apply an inverted first deep power down signal PDPDE1 having the external voltage Vcc level to the PMOS transistor PM. The PMOS transistor PM may be turned off in response to the inverted first deep power down signal PDPDE1 having the external voltage Vcc level, and the first node Node1 may become a floating state.

The comparator AMP may receives the reference voltage Vref and the internal voltage Vint and may detect a voltage difference between the two voltages Vref and Vint. If the internal voltage Vint is lower in voltage level than the reference voltage Vref, the comparator AMP may lower a voltage level to be outputted to the first node Node1. Therefore, the driving PMOS transistors PD1 to PDn may selectively apply the external voltage Vcc to raise a voltage level of the internal voltage Vint, as applied to the driving node Node31 in response to a voltage level of the first node Node1.

If the internal voltage Vint is higher in voltage level than the reference voltage Vref, the comparator AMP may raise a voltage level to be outputted to the first node Node1. Therefore, the driving PMOS transistors PD1 to PDn may selectively apply the external voltage Vcc to lower a voltage level of the internal voltage Vint, as applied to the driving node Node31 in response to a voltage level of the first node Node1.

The second inverter INV2 of the leakage current preventing portion 33 may invert the inverted first deep power down signal PDPDE1 having the external voltage Vcc level outputted from the first inverter INV1 to output the first deep power down signal PDPDE1 having the substrate voltage Vbb level. The control PMOS transistor PQ2 may be turned on to apply the internal voltage Vint of the driving node Node31 to the internal voltage node Node32 in response to the first deep power down signal PDPDE1 having the substrate voltage Vbb level.

When the semiconductor device is in the deep power down mode, the first deep power down signal PDPDE1 may be applied to the internal voltage generator with a high level. The first inverter INV1 may invert the first deep power down signal PDPDE1 having a high level and apply an inverted first deep power down signal PDPDE1 having the substrate voltage Vbb level to the PMOS transistor PM. The PMOS transistor PM may be turned on to apply the external voltage Vcc to the first node Node1 in response to the inverted first deep power down signal PDPDE1 having the substrate voltage Vbb level.

All of the driving PMOS transistors PD1 to PDn may be turned off in response to the first node Node1 having the external voltage Vcc level, so that a voltage of the driving node Node31 becomes a floating state and an electric current may not flow.

The second inverter INV2 of the leakage current preventing portion 33 may invert the inverted first deep power down signal PDPDE1 having the substrate voltage Vbb level outputted from the first inverter INV1 to output the first deep power down signal PDPDE1 having the external voltage Vcc level. The control PMOS transistor PQ2 may be turned off to interrupt an electric current which may flow from the driving node Node31 to the internal voltage node Node32 in response to the first deep power down signal PDPDE1 having the external voltage Vcc level.

The internal voltage generator of FIG. 2 may be configured such that the leakage current preventing portion 23 may be located between the external voltage Vcc and the internal voltage driving portion 22 to prevent the external voltage Vcc from being applied to the internal voltage driving portion 22 during the deep power down mode, whereas the internal voltage generator of FIG. 3 may be configured such that the leakage current preventing portion 33 may be located between the driving node Node31 and the internal voltage driving node Node32 to interrupt an electric current which may flow from the driving node Node31 to the internal voltage node Node32. Like the internal voltage generator of FIG. 2, the internal voltage generator of FIG. 3 may interrupt an electric current which flows to the internal portion of the semiconductor device through the leakage current preventing portion 33 and the internal voltage driving portion 32 during the deep power down mode, thereby interrupting a leakage current.

The internal voltage generators of FIGS. 2 and 3 may be configured such that only the first deep power down signal PDPDE1 is applied, but they may be also configured such that a second deep power down signal PDPDE2 is applied. In this instance, the first deep power down signal PDPDE1 may swing between the external voltage Vcc level and the ground voltage Vss level, and the second deep power down signal PDPDE2 may swing between the external voltage Vcc level and the substrate voltage Vbb level. If the first deep power down signal PDPDE1 is applied to the first inverter INV1 and the second deep power down signal PDPDE2 is applied to the control PMOS transistors PQ1 and/or PQ2, the second inverters INV2 of the leakage current preventing portions 23 and 33 may not need be needed. The first inverter INV1 may receive the external voltage Vcc and the ground voltage Vss as a driving voltage.

Figure 4:
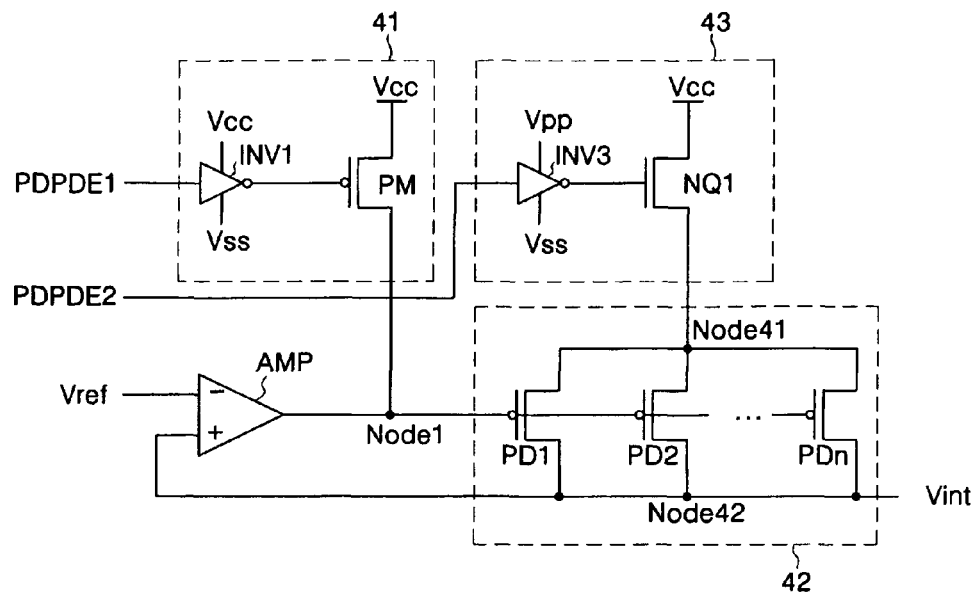
FIG. 4 is a circuit diagram illustrating another internal voltage generator according to example embodiments.

FIG. 4 is a circuit diagram illustrating another internal voltage generator according to example embodiments. The internal voltage generator of FIG. 4 may include a mode determining portion 41, a comparator AMP, an internal voltage driving portion 42, and a leakage current preventing portion 43. The mode determining portion 41, the comparator AMP and the internal voltage driving portion 42 may have a similar configuration to those of FIG. 1. Unlike the leakage current portions 23 and 33 of FIGS. 2 and 3, the leakage current portion 43 of FIG. 4 may include a control NMOS transistor NQ1. The internal voltage generator of FIG. 4 may receive two deep power down signals PDPDE1 and PDPDE2. The first deep power down signal PDPDE1 may be a signal which swings at a voltage level between the external voltage Vcc and the ground voltage Vss, similar to the deep power down signal PDPDE of FIG. 1, whereas the second deep power down signal PDPDE2 may be a signal which swings at a voltage level between a boosted voltage Vpp and the ground voltage Vss.

In FIG. 4, the leakage current preventing portion 43 may include a third inverter INV3 and a control NMOS transistor NQ1. The third inverter INV3 may receive the second deep power down signal PDPDE2 and output an inverted second deep power down signal PDPDE2. The control NMOS transistor NQ1 may apply the external voltage Vcc to the driving node Node41 in response to the inverted second deep power down signal PDPDE2 outputted from the third inverter INV3.

The control NMOS transistor NQ1 may be turned on to apply a voltage Vcc-Vth obtained by subtracting a threshold voltage Vth of the control NMOS transistor NQ1 from the external voltage Vcc to the driving node Node41 in response to the inverted second deep power down signal PDPDE2 having the boosted voltage Vpp level applied during the normal mode. The control NMOS transistor NQ1 may interrupt the external voltage Vcc from being applied to the driving node Node41 in response to the inverted second deep power down signal PDPDE2 having a ground voltage Vss level during the deep power down mode.

FIG. 4 shows one control NMOS transistor NQ1, but a plurality of control NMOS transistors NQ1 may be arranged in order to sufficiently supply an electric current to the internal portion of the semiconductor device through the internal voltage driving portion 42. Alternatively, one large-scaled control NMOS transistor NQ1 may be arranged to sufficiently supply an electric current to the internal voltage driving portion 42.

In order to make it easier for the control NMOS transistor NQ1 to supply an electric current to the internal voltage driving portion 42, the inverted second deep power down signal PDPDE2 applied to the control NMOS transistor NQ1 may swing between the ground voltage Vss level and the boosted voltage Vpp level. That is, the boosted voltage Vpp having a voltage level higher than the external voltage Vcc level, may be applied to the gate of the control NMOS transistor NQ1 to make a turn-on operation of the control NMOS transistor NQ1 smoother.

The third inverter INV3 may be driven by the boosted voltage Vpp and the ground voltage Vss to apply the inverted second deep power down signal PDPDE2, which swings between the ground voltage Vss level and the boosted voltage Vpp level, at the control NMOS transistor NQ1. The second deep power down signal PDPDE2 may be an input signal of the third inverter INV3, which may swing between the ground voltage Vss level and the boosted voltage Vpp level to thereby be inverted at the third inverter INV3.

In order to make it easier for the control NMOS transistor NQ1 to supply an electric current to the internal voltage driving portion 42, a swing voltage level of the second deep power down signal PDPDE2 and a voltage level of the driving voltage of the third inverter INV3 may be set to the boosted voltage Vpp level and the ground voltage Vss level. However, if the control NMOS transistor NQ1 is stably turned on at the external voltage Vcc level, a swing voltage level of the second deep power down signal PDPDE2 and a voltage level of the driving voltage of the third inverter INV3 may be set to the external voltage Vcc level and the ground voltage Vss level. If the second deep power down signal PDPDE2 is set to swing between the external voltage Vcc level and the ground voltage Vss level, since the first deep power down signal PDPDE1 is similar to the second deep power signal PDPDE2, there may be no need for receiving the second deep power down signal PDPDE2. Also, as an output of the first inverter INV1 may be applied directly to a gate of the control NMOS transistor NQ1, the third inverter INV3 may not be needed.

In the internal voltage generator of FIG. 4, operations of the mode determining portion 41, the comparator AMP and the internal voltage driving portion 42 may be identical or similar to those of FIG. 2, and so descriptions thereof are omitted.

The first and second deep power down signals PDPDE1 and PDPDE2 may be applied to the internal voltage generator with a low level during the normal mode and may be applied to the internal voltage generator with a high level during the deep power down mode. Since the first deep power down signal PDPDE1 applied to the internal voltage generator may be an input signal of the first inverter INV1, a low level may be the ground voltage Vss level, and a high level may be the external voltage Vcc level. Since the second deep power down signal PDPDE2 may be an input signal of the third inverter INV3, a low level may be the ground voltage Vss level, and a high level may be the boosted voltage Vpp level.

When the semiconductor device is in the normal mode, the first and second deep power down signals PDPDE1 and PDPDE2 of the ground voltage Vss level may be applied to the first and third inverters INV1 and INV3, respectively. The third inverter INV3 may inverts the second deep power down signal PDPDE2 of the ground voltage Vss level and apply the inverted second deep power down signal PDPDE2 having the boosted voltage Vpp level to the control NMOS transistor NQ1. The control NMOS transistor NQ1 may apply a voltage Vcc-Vth, obtained by subtracting a threshold voltage Vth of the control NMOS transistor NQ1 from the external voltage Vcc, to the driving node Node41 in response to the inverted second deep power down signal PDPDE2 having the boosted voltage Vpp level.

When the semiconductor device is in the deep power down mode, the second deep power down signal PDPDE2 of the boosted voltage Vpp level may be applied to the third inverter INV3. The control NMOS transistor NQ1 may interrupt the external voltage Vcc in response to the inverted second deep power down signal PDPDE2 of the ground voltage Vss level outputted from the third inverter INV3, and the driving node 41 may become a floating state.

Accordingly, during the deep power down mode, the internal voltage generator of FIG. 4 may interrupt an electric current which flows to the internal portion of the semiconductor device through the internal voltage driving portion 42 and the leakage current preventing portion 43, thereby interrupting a leakage current.

Figure 5:
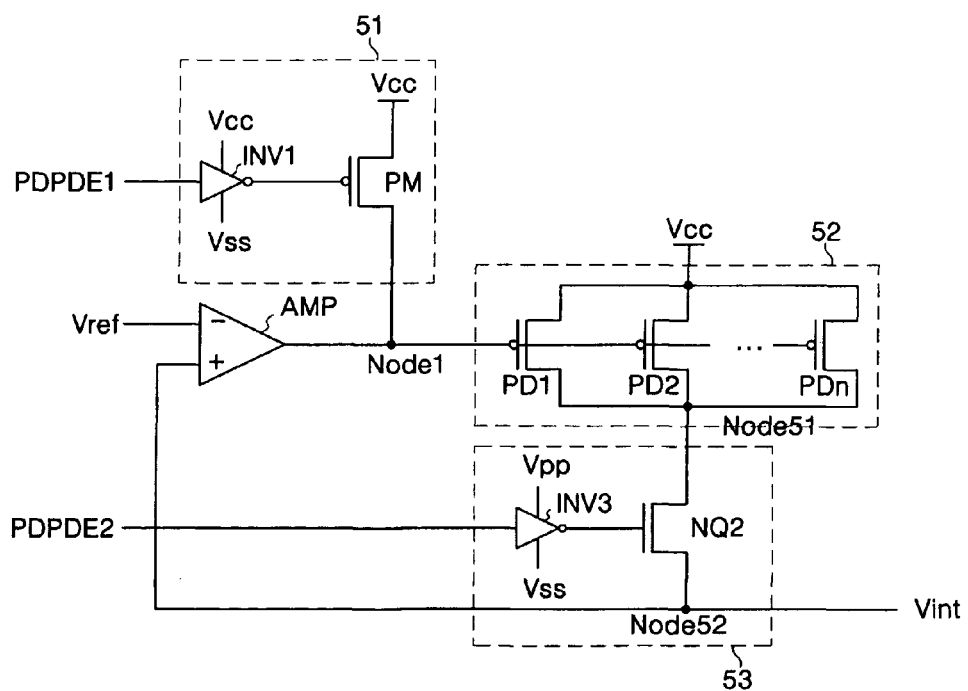
FIG. 5 is a circuit diagram illustrating another internal voltage generator according to example embodiments.

FIG. 5 is a circuit diagram illustrating another internal voltage generator according example embodiments. The internal voltage generator of FIG. 5 may include a mode determining portion 51, a comparator AMP, an internal voltage driving portion 52, and a leakage current preventing portion 53. The mode determining portion 51, the comparator AMP and the internal voltage driving portion 52 may have a similar configuration to those of FIG. 1. Like the leakage current portion of FIG. 4, the leakage current portion 53 of FIG. 5 may include a control NMOS transistor NQ2. The internal voltage generator of FIG. 4 may receive two deep power down signals PDPDE1 and PDPDE2. The first deep power down signal PDPDE1 may be a signal which swings at a voltage level between the external voltage Vcc and the ground voltage Vss, whereas the second deep power down signal PDPDE2 may be a signal which swings at a voltage level between a boosted voltage Vpp and the ground voltage Vss.

In FIG. 5, the leakage current preventing portion 53 may include a third inverter INV3 and a control NMOS transistor NQ2. The third inverter INV3 may receive the second deep power down signal PDPDE2 and output an inverted second deep power down signal PDPDE2. The control NMOS transistor NQ2 may apply a voltage obtained by subtracting a threshold voltage Vth of the control NMOS transistor NQ2 from a voltage level of the driving node Node51 to an internal voltage node Node52 in response to the inverted second deep power down signal PDPDE2 outputted from the third inverter INV3.

The control NMOS transistor NQ2 may be turned on to apply a voltage Vcc-Vth at driving node Node52 obtained by subtracting a threshold voltage Vth of the control NMOS transistor NQ2 from the external voltage Vcc applied to the driving node Node51 in response to the inverted second deep power down signal PDPDE2 having the boosted voltage Vpp level applied during the normal mode. The control NMOS transistor NQ2 may interrupt an electric current which flows to the internal voltage node node52 from the driving node Node51 in response to the inverted second deep power down signal PDPDE2 having a ground voltage Vss level during the deep power down mode.

FIG. 5 shows one control NMOS transistor NQ2, but a plurality of control NMOS transistors NQ2 may be arranged in order to sufficiently supply an electric current to the internal portion of the semiconductor device through the internal voltage driving portion 52. Alternatively, one large-scaled control NMOS transistor NQ2 may be arranged to sufficiently supply an electric current to the internal voltage driving portion 52.

In order to make it easier for the control NMOS transistor NQ2 to supply an electric current to the internal voltage driving portion 52, the inverted second deep power down signal PDPDE2 applied to the control NMOS transistor NQ2 may swing between the ground voltage Vss level and the boosted voltage Vpp level.

The third inverter INV3 may be driven by the boosted voltage Vpp and the ground voltage Vss to apply the inverted second deep power down signal PDPDE2, which may swing between the ground voltage Vss level and the boosted voltage Vpp level to be applied to NMOS transistor NQ2. The second deep power down signal PDPDE2 may be an input signal of the third inverter INV3 that swings between the ground voltage Vss level and the boosted voltage Vpp level.

In order to make it easier for the control NMOS transistor NQ2 to supply an electric current to the internal voltage driving portion 52, a swing voltage level of the second deep power down signal PDPDE2 and a voltage level of the driving voltage of the third inverter INV3 may be set to the boosted voltage Vpp level and the ground voltage Vss level. However, if the control NMOS transistor NQ21 is stably turned on at the external voltage Vcc level, a swing voltage level of the second deep power down signal PDPDE2 and a voltage level of the driving voltage of the third inverter INV3 may be set to the external voltage Vcc level and the ground voltage Vss level. If the second deep power down signal PDPDE2 is set to the external voltage Vcc level and the ground voltage Vss level, since the first deep power down signal PDPDE1 is similar to the second deep power signal PDPDE2, there may be no need for receiving the second deep power down signal PDPDE2. As an output of the first inverter INV1 may be applied directly to a gate of the control NMOS transistor NQ2, the third inverter INV3 may be not needed.

In the internal voltage generator of FIG. 5, operations of the mode determining portion 51, the comparator AMP and the internal voltage driving portion 52 may be identical or similar to those of FIG. 3, and descriptions of those thereof are omitted.

The first and second deep power down signals PDPDE1 and PDPDE2 may be applied to the internal voltage generator with a low level during the normal mode and may be applied to the internal voltage generator with a high level during the deep power down mode. Since the first deep power down signal PDPDE1 applied to the internal voltage generator may be an input signal of the first inverter INV1, a low level may be the ground voltage Vss level, and a high level may be the external voltage Vcc level. Since the second deep power down signal PDPDE2 may be an input signal of the third inverter INV3, a low level may be the ground voltage Vss level, and a high level may be the boosted voltage Vpp level. When the semiconductor device is in the normal mode, the first and second deep power down signals PDPDE1 and PDPDE2 of the ground voltage Vss level may be applied to the first and third inverters INV1 and INV3, respectively. The third inverter INV3 may invert the second deep power down signal PDPDE2 of the ground voltage Vss level and apply the inverted second deep power down signal PDPDE2 having the boosted voltage Vpp level to the control NMOS transistor NQ2. The control NMOS transistor NQ2 may apply to the internal voltage node Node52 a voltage obtained by subtracting a threshold voltage Vth of the control NMOS transistor NQ2 from a voltage applied to the driving node Node51 by the internal voltage driving portion 52 in response to the inverted second deep power down signal PDPDE2 having the boosted voltage Vpp level.

When the semiconductor device is in the deep power down mode, the second deep power down signal PDPDE2 of the boosted voltage Vpp level may be applied to the third inverter INV3. The control NMOS transistor NQ2 may interrupt a voltage applied from the driving node Node51 to the internal voltage driving portion 52 in response to the inverted second deep power down signal PDPDE2 of the ground voltage Vss level outputted from the third inverter INV3, and the driving node 51 may become a floating state.

Accordingly, during the deep power down mode, the internal voltage generator of FIG. 5 may interrupt an electric current which flows to the internal portion of the semiconductor device through the internal voltage driving portion 52 and the leakage current preventing portion 53, thereby interrupting a leakage current.

As described above, the internal voltage generator according to example embodiments interrupts a leakage current which flows to the internal voltage node through the leakage current prevent portion and the internal voltage driving portion.

It will be apparent to those skilled in the art that modifications and variations may be made to example embodiments without deviating from the spirit or scope of example embodiments. Thus, it is intended that example embodiments may cover any such modifications and variations, provided they come within the scope of the appended claims and their equivalents. Accordingly, these and other changes and modifications are seen to be within the true spirit and scope of example embodiments, as defined by the appended claims.

In the drawings and specification, there have been disclosed example embodiments, and although specific terms are employed, they are used in a generic and descriptive sense only and not for purposes of limitation, the scope of example embodiments being set forth in the following claims.

What is claimed is:

1. An internal voltage generator, comprising:
    an internal voltage driving portion connected between a driving node and an internal voltage node for applying an internal voltage to the internal voltage node in response to a voltage level of a first node; and
    a leakage current interrupting portion to apply an external voltage to the first node to deactivate the internal voltage driving portion and to interrupt the external voltage applied to the driving node to thereby interrupt a leakage current, during a deep power down mode.

2. The internal voltage generator of claim 1, further comprising:
    a comparator to control a voltage of the first node in response to a voltage difference between a reference voltage and the internal voltage.

3. The internal voltage generator of claim 1, wherein the internal voltage driving portion includes at least one driving PMOS transistor connected in parallel between the driving node and the internal voltage node, the at least one driving PMOS transistor to selectively apply a voltage of the driving node to the internal voltage node in response to a voltage level of the first node.

4. The internal voltage generator of claim 3, wherein the leakage current interrupting portion includes:
   a mode determining portion to apply the external voltage to the first node in response to a first deep power down signal and to output an inverted first deep power down signal; and
   a leakage current preventing portion to interrupt the external voltage applied to the driving node in response to the inverted first deep power down signal.

5. The internal voltage generator of claim 4, wherein the mode determining portion includes:
   a first inverter connected between the external voltage and a substrate voltage, the first inverter to invert the first deep power down signal and output the inverted first deep power down signal; and
   a mode determining PMOS transistor connected between the external voltage and the first node, the mode determining PMOS transistor to apply the external voltage to the first node in response to the inverted first deep power down signal.

6. The internal voltage generator of claim 4, wherein the leakage current preventing portion includes:
   a second inverter connected between the external voltage and a substrate voltage, the second inverter to invert the inverted first deep power down signal; and
   at least one control PMOS transistor connected in parallel between the external voltage and the driving node, the at least one control PMOS transistor to interrupt a voltage applied to the driving node in response to an output signal of the second inverter.

7. The internal voltage generator of claim 3, wherein the leakage current interrupting portion includes:
   a mode determining portion to apply the external voltage to the first node in response to a first deep power down signal; and
   a leakage current preventing portion to interrupt the external voltage applied to the driving node in response to a second deep power down signal having a same phase as the first deep power down signal.

8. The internal voltage generator of claim 7, wherein the mode determining portion includes:
   a first inverter connected between the external voltage and a ground voltage, the first inverter to invert the first deep power down signal and output the inverted first deep power down signal; and
   a mode determining PMOS transistor connected between the external voltage and the first node, the mode determining PMOS transistor to apply the external voltage to the first node in response to the inverted first deep power down signal.

9. The internal voltage generator of claim 7, wherein the leakage current preventing portion includes:
   a second inverter connected between a boosted voltage and a ground voltage, the second inverter to invert the second deep power down signal; and
   at least one control PMOS transistor connected in parallel between the external voltage and the driving node, the at least one control PMOS transistor to interrupt a voltage applied to the driving node in response to the inverted second deep power down signal.

\* \* \* \* \*